United States Patent [19]

Kawai

[11] Patent Number: 5,532,633
[45] Date of Patent: Jul. 2, 1996

[54] CLOCK GENERATING CIRCUIT GENERATING A PLURALITY OF NON-OVERLAPPING CLOCK SIGNALS

[75] Inventor: Shuichi Kawai, Tokyo, Japan

[73] Assignee: NEC Corporaton, Tokyo, Japan

[21] Appl. No.: 352,086

[22] Filed: Nov. 30, 1994

[30] Foreign Application Priority Data

Dec. 3, 1993 [JP] Japan ................... 5-338975

[51] Int. Cl.⁶ .................................. H03K 3/017
[52] U.S. Cl. ................ 327/174; 327/176; 327/118; 327/235; 327/251; 327/299
[58] Field of Search ................... 327/172, 175, 327/233, 234, 235, 237, 239, 250, 251, 258, 259, 291, 298, 299, 117, 118, 174, 176

[56] References Cited

U.S. PATENT DOCUMENTS

| | | | |
|---|---|---|---|
| 3,660,767 | 5/1972 | Yoshino et al. | 327/115 |
| 3,863,161 | 1/1975 | Johnson et al. | 327/39 |
| 4,109,209 | 8/1978 | Bismarck | 327/269 |
| 4,420,696 | 12/1983 | Gemma et al. | 327/239 |
| 4,504,960 | 3/1985 | Yamada | 327/160 |
| 4,645,947 | 2/1987 | Prak | 327/239 |
| 4,658,217 | 4/1987 | Takatori et al. | 327/98 |
| 4,695,873 | 9/1987 | Smith | 327/35 |
| 4,816,700 | 3/1989 | Imel | 327/154 |
| 5,148,050 | 9/1992 | Koide | 327/115 |
| 5,424,668 | 1/1995 | Kohsaka | 327/175 |

FOREIGN PATENT DOCUMENTS

| | | |
|---|---|---|
| 0606912A2 | 7/1994 | European Pat. Off. . |
| 3740362A1 | 11/1987 | Germany . |
| 59-207725 | 11/1984 | Japan ................ 327/175 |

*Primary Examiner*—Terry Cunningham
*Attorney, Agent, or Firm*—Whithman, Curtis, Whitham & McGinn

[57] ABSTRACT

A first basic clock supplied from outside is delayed by a first delay circuit to generate a second basic clock which is fed to a frequency divider to generate a group of multi-phase clocks, each of which has a clock width equal to an integer number multiple of the clock width of the second basic clock and has a phase delay sequentially by a value equal to an integer number multiple of the clock period of the second basic clock, wherein the (n−1)th multi-phase clock and a nth multi-phase clock neighboring to each other in the phase sequence, and the first basic clock, are fed to a delay generating circuit as inputs, which comprises a second delay circuit for delaying the (n−1)th clock in the phase sequence, and a circuit arrangement for generating an output clock phase having a delay time relative to the nth clock, being equal to an smaller value of one half clock width of the first basic clock minus a delay time of the first delay circuit and a delay time of the second delay circuit.

7 Claims, 15 Drawing Sheets

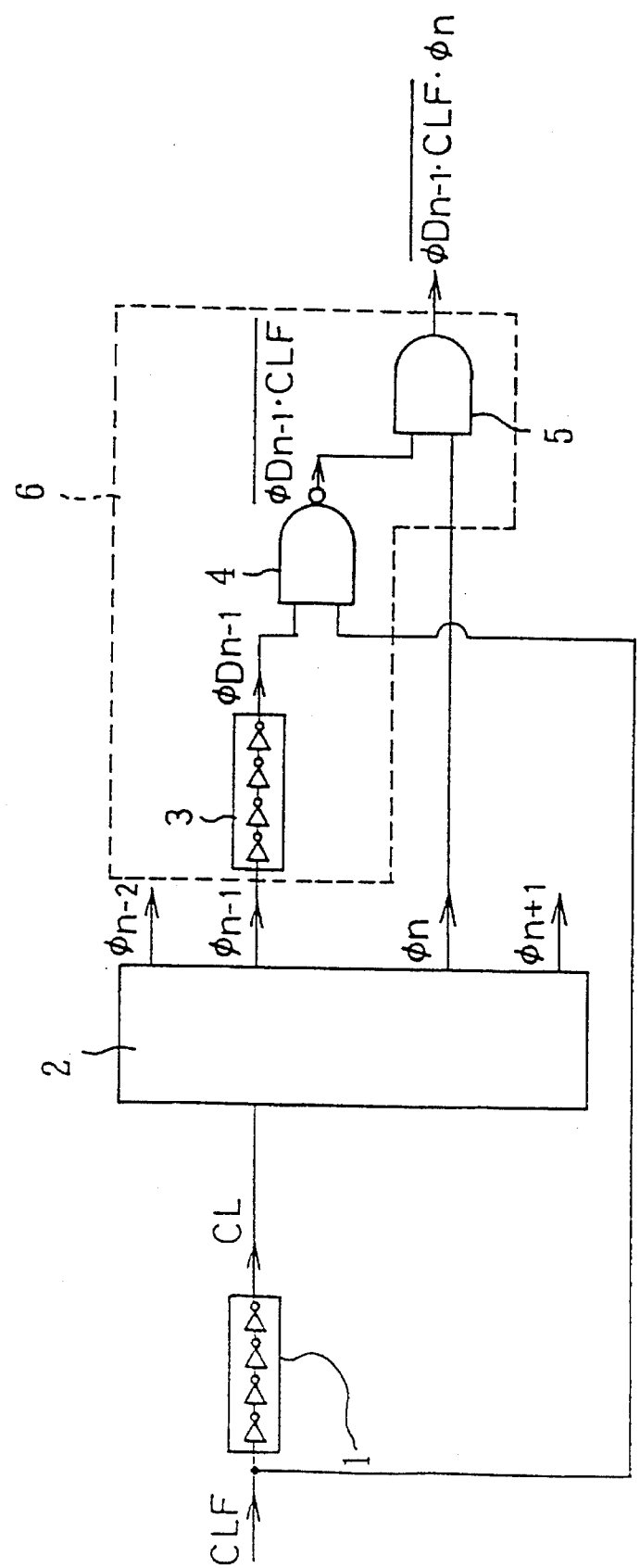

CLOCK GENERATING CIRCUIT GENERATING A PLURALITY OF NON-OVERLAPPING CLOCK SIGNALS

BACK GROUND OF THE INVENTION

1. Field of the Invention

This invention relates to a clock generating circuit and, more particularly, to a circuit generating a plurality of clocks signals in response to a reference clock signal.

2. Related Art

In a digital signal processing apparatus, typified by a micro-computer, multi-phase clocks are employed as clocks for providing generating timings to respective internal circuits to establish synchronization thereamong. Each of the multi-phase clocks is produced by frequency-dividing a reference (or master) clock CL.

Referring to FIG. 6, as an example, four-phase clocks $\Phi_1$, $\Phi_2$, $\Phi_3$ and $\Phi_4$ 4 are derived from a reference clock CL. Specifically, the reference clock CL has a predetermined rate of frequency indicated by one cycle period 41, and the four clocks $\Phi_1$, $\Phi_2$, $\Phi_3$ and $\Phi_4$, each of which is derived by frequency-dividing the reference clock CL, have respective active widths 42 each equal to the clock cycle period 41 of the reference clock CL and respective phases shifted from one another one cycle by one cycle of the reference clock CL as shown in FIG. 5. Thus a given one of the four-phase clocks has a falling edge that coincides with the rising edge timing of a succeeding one.

In a micro-computer fabricated on a single semiconductor chip, there inevitably exists differences in interconnection resistance or interconnection capacity from one interconnection of the clock distribution circuit to another. Consequently, should the clocks, each of which is derived by frequency-dividing a reference clock in the above mentioned manner, be directly distributed among respective circuits, there are produced differences in delay time between clocks distributed, as a result of which these clocks are overlapped with one another by a certain time length to thereby cause a circuit malfunction.

For overcoming such problem, the conventional practice in a micro-computer is to produce newly a group of clocks $CK_1$ to $CK_4$, which are shown in FIG. 17 and arranged to have narrower active widths, from the frequency-divided clocks $\Phi_1$ to $\Phi$ and to employ the group of these newly generated non-overlapping clocks. With the newly produced clock group, since there is a timing interval between the active period of a given clock and the active period of the succeeding clock, that is a clock-to-clock delay 72, there is no risk of clock overlap within the circuit of the micro-computer employing such clock group.

Such non-overlapping four-phase clocks $CK_1$, $CK_2$, $CK_3$ and $CK_4$ are generated by a circuit as shown in FIG. 15. Note that FIG. 15 indicates a circuit portion generating only one of the non-overlapping four-phase clocks CK. In the circuit of FIG. 11, a circuit for generating this circuit portion 71 is made up of a delay circuit 3 composed of plurality of inverters in a cascade connection, an inverter 7 and a two-input AND gate 5. The delay circuit 3 receives and thus delays one clock $\Phi_{n-1}$ of the four-phase clocks $\Phi_1$, $\Phi_2$, $\Phi_3$ and $\Phi_4$ produced by frequency-dividing a reference clock CL by a frequency divider 2. A clock $\Phi D_{n-1}$ which is a delayed signal of the clock $\Phi_{n-1}$, is thereby outputted from the delay circuit 3. It is noted that an index number n denotes one of cyclic integers of from 1 to 4, that is, an index number n is represented as a number of modulo 4 so that for n=1, $\Phi_{n-1}=\Phi_0=\Phi_4$, that is, index number 0 is equivalent to index number 4.

The output signal $\Phi D_{n-1}$ is further inverted by the inverter 7 to produce an inverted signal $\overline{\Phi D_{n-1}}$ which is in turn fed to one input terminal of the two-input AND gate 5, the other input terminal of which is fed with the next phase clock $\Phi_n$ following the clock $\Phi_{n-1}$. A signal $\overline{\Phi D_{n-1}} \cdot \Phi_n$ is thus outputted from the output terminal of the two-input AND gate 5. The symbol "⁻" and the symbol "." denote signal inversion and logical product, respectively.

Referring to FIG. 18 illustrative of an operation of the circuit 71, the clock $\Phi_{n-1}$ is then generated by the dalay circuit 3. The signal $\Phi Dd_{n-1}$ is inverted to produce a signal $\overline{D_{n-1}}$ which is in turn ANDed with the next phase clock $\Phi_n$ following the clock $\Phi_{n-1}$. The clock signal $\overline{\Phi D_{n-1}} \cdot \Phi_n$ is thereby generated. The phase difference between the clock signal $\overline{\Phi D_{n-1}} \cdot \Phi_n$ and the clock $\Phi_n$ is represented as the clock-to-clock delay 72 corresponding to the delay time of the delay circuit 3.

In order to obtain the non-overlapping four-phase clock signals $CK_1$ to $CK_4$, an actual clock generating circuit includes four circuit portions 72 as shown in FIG. 16. With this construction, the clock signals $CK_1$ to $CK_4$ are given by $CK_1=(\overline{\Phi D_4} \cdot \Phi_1)$, $CK_2=(\overline{\Phi D}_{1 \cdot \Phi 2})$, $CK_3=(\overline{D_2} \cdot \Phi_3)$ and $CK_4=(\overline{\Phi D_3} \cdot \Phi_4)$, respectively.

However, the delay time determined by the delay circuit 3 depends upon the power supply voltage applied thereto. That is, the clock-to-clock delay 72 is varied depending on the power supply voltage. For example, as the power supply voltage reduces, the delay time of each delay circuit 13, i.e., the clock-to-cock delay 72, is prolonged, so that a sufficient clock active width 42 cannot be obtained for each clock signal CK. If the sufficinet clock active width 42 cannot be obtained, the circuit employing these clocks cannot complete expected operations within such a short clock active period, thus producing malfunctions.

SUMMARY OF THE INVENTION

It is therefore an object of the present invention to provide an improved clock generator. It is another object of the present invention to provide a clock generator generating a plurality of non-overlapping clock signals having a clock-to-clock delay therebetween which is not increased beyond a certain value against change in power supply voltage.

A clock generator according to the present invention comprises;

a first delay circuit receiving a reference clock signal and producing a delayed reference clock signal;

first circuit means responsive to said delayed reference clock signal for generating a set of intermediate clock signals, each of said intermediate clock signals having a clock active width equal to an integer number multiple of one cycle period of said delayed reference clock signal, and said intermediate clock signals having respective clock active widths which are delayed in sequence by a value equal to said integer number of multiple of the clock width of said second reference clock; and at least a delay generating circuit receiving an (n−1)th intermediate clock signal and an nth intermediate clock signal of said intermediate clock signals neighboring to each other in a phase sequence and said reference clock signal and including a second delay circuit receiving said (n−1)th intermediate clock signal and producing a delayed intermediate clock signal and a circuit arrangement responding to said delayed intermediate clock signal, said nth intermediate clock signal and said reference clock signal and generating an output clock signal having a delay time relative to said nth intermediate clock signal, said delay time being defined by one of a delay time of the first delay circuit and a delay time of said second delay circuit.

With such a construction as described above, when the delay time of the second delay circuit is prolonged larger than that of the first delay circuit, the output clock signal is generated with such a delay time with respect to the nth intermediate clock signal that is restricted to the delay time of the first delay time. Accordingly, even if the clock-to-clock delay is changed such as under low voltage operations, the clock-to-clock delay is not increased beyond a pre-set upper limit. Besides, a clock active width may also be set to an optional value.

BRIEF DESCRIPTION OF THE DRAWINGS

The above and other objects, advantages and features of the present invention will be more apparent from the following description taken in conjunction with the accompanying drawings, in which FIG. 1 is a circuit diagram showing an arrangement of a first embodiment of the present invention;

DETAILED DESCRIPTION OF THE PREFERRED EMBODIMENTS

Figure 6:
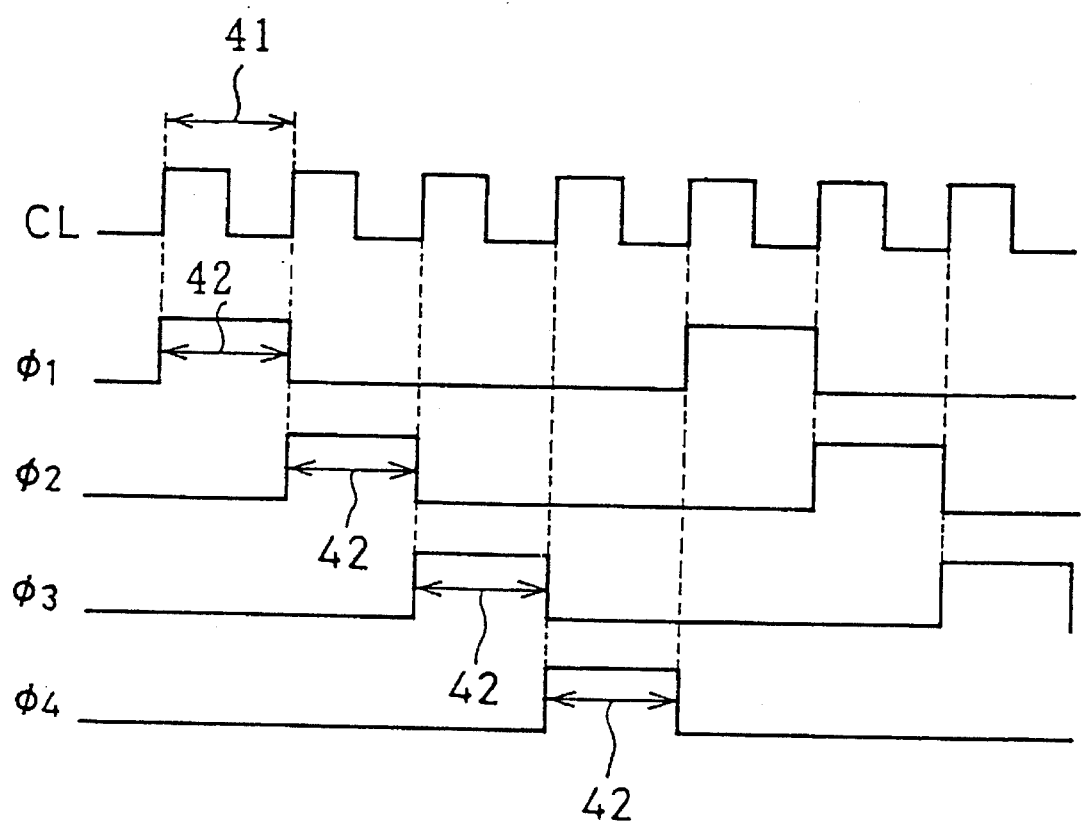
FIG. 6 is a timing chart for a group of multi-phase clocks employed in the clock generator of the present invention.

Referring to FIG. 1, the clock generator according to the first embodiment of the present invention includes a delay circuit 1 composed of a plurality of inverters connected in series. This delay circuit receives and thus delays a reference clock signal CLF to thereby produce a delayed reference clock signal CL which is in turn supplied to a divider 2. This divider 2 frequency-divides the delayed reference clock signal CL to produce four clock signals $\Phi_{n-2}$, $\Phi_{n-1}$, $\Phi_n$ and $\Phi_{n+1}$ (n=3). That is, the divider 2 produces four-phase clock signals $\Phi_1$, $\Phi_2$, $\Phi_3$ and $\Phi_4$ as shown in FIG. 6.

The clock signal $\Phi_{n-1}$ and the succeeding clock signal $\Phi_n$ are supplied to a circuit portion 6 together with the reference clock signal CLF in accordance with the present invention. This circuit portion 6 includes a delay circuit 3, a NAND gate 4 and an AND gate 5. The delay circuit 3 is composed of a plurality of inverters connected in series and thus produces a delayed clock signal $\Phi_{n-1}$. This signal $\Phi D_{n-1}$ is supplied to the first input mode of the NAND gate having the second input mode supplied with the reference clock signal CLF. The output of the NAND gate 4 is supplied to the AND gate 5 together with the clock signal $\Phi_n$. The AND gate 5 thus produces a required output clock signal.

Figure 2A:
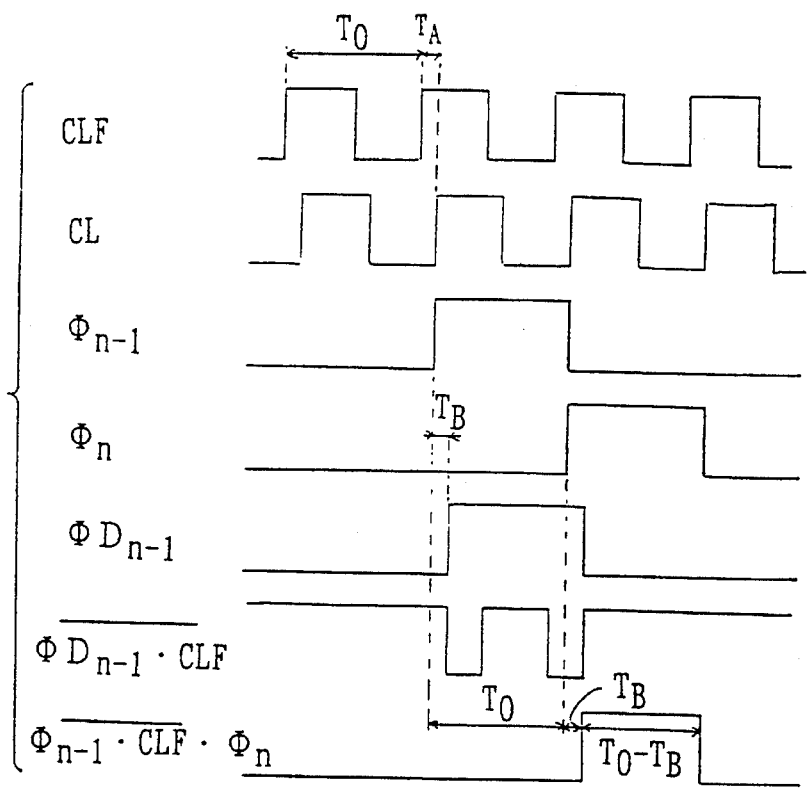
FIGS. 2A and 2B are timing charts indicating an operation of the circuit shown in FIG. 1.

Referring to FIG. 2A, in a typical value of a power supply voltage applied to the clock generator, the delayed reference clock CL is derived with a delay time $T_A$ with reference to the raw reference clock CLF, and the delayed clock signal $\Phi D_{n-1}$ is derived with a delay time $T_B$ with reference to the clock signal $\Phi_{n-1}$. The NAND gate 4 thus produces its output $\overline{\Phi D_{n-1} \cdot CLF}$ as shown in FIG. 2A. As a result, the output clock signal $\overline{\Phi D_{n-1}} \cdot CF \cdot \Phi^n$ from the AND gate 5 has its leading edge delayed by a time period of $(T_0 + T_B)$ from the leading edge of the clock signal $\Phi_{n-1}$. Note that $T_0$ represents one cycle period of the raw reference signal CLF. Moreover, the output clock has an active clock width of $(T_0 - T_B)$.

Figure 2B:
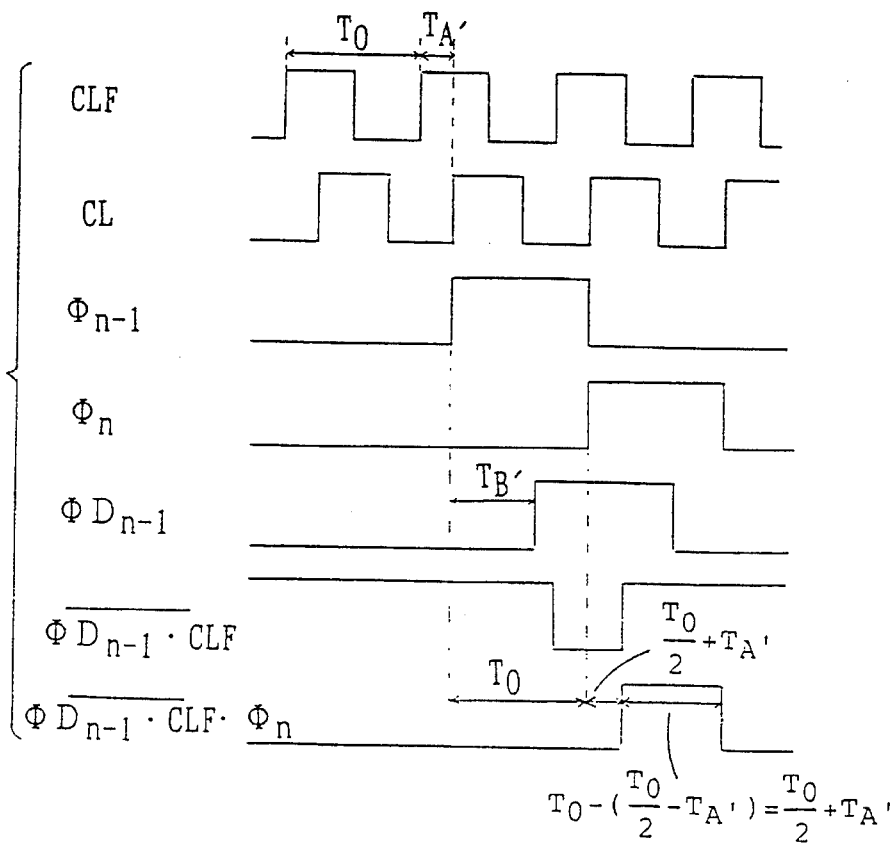

On the other hand, when the power supply voltage is lowered, each of the delay time periods of the delay circuits 1 and 3 is prolonged as shown by $T_A$, and $T_B$, in FIG. 2B. In this drawing, particularly, the delay time period $T_B'$ of the delay circuit 3 becomes considerably large because the circuit elements constituting the delay circuit 3 has large deviation in electrical characteristic from a desired value. However, by the NAND gate receiving the delayed clock signal $\Phi D_{n-1}$ and the raw reference clock signal CLF, the leading edge of the output clock from the AND gate 5 appears with a delay period of $(T_0 + T_0/2 - T_A)$, with respect to the leading edge of the clock signal $\Phi_{n-1}$, as shown n FIG. 2B Moreover, the output clock $\overline{\Phi D_{n-1}} \cdot CLF \cdot \Phi_n$ has an active pulse width of $(T_0/2 + T_A, )$. Thus, the reduction in the active pulse width of the output clock is restricted to such a width that is a half cycle period of the reference clock CLF plus the delay time period of the delay circuit 1.

When the power voltage is further lowered, the delay time period $T_A$ of the delay circuit 1 may become longer than the half cycle period $T_0/2$ of the clock signal CLF(CL). In this case, the output clock from the AND gate 5 may have an active high level smaller than the half cycle period $T_0/2$. In order to solve this problem, it is preferable to modify the circuit shown in FIG. 1 such that the NAND gate 4 have three inputs to further receive the delayed reference clock signal CL from the delay circuit 1 in addition to the reference clock CLF and the delayed clock $\Phi_{n-1}$. With this modification, the active high period of the output clock from the AND gate 5 is restricted to the half cycle period $T_0/2$ of the clock CLF(CL) even when the delay time $T_A$ of the delay circuit 1 becomes larger than the half cycle period $T_0/2$.

Figure 3:
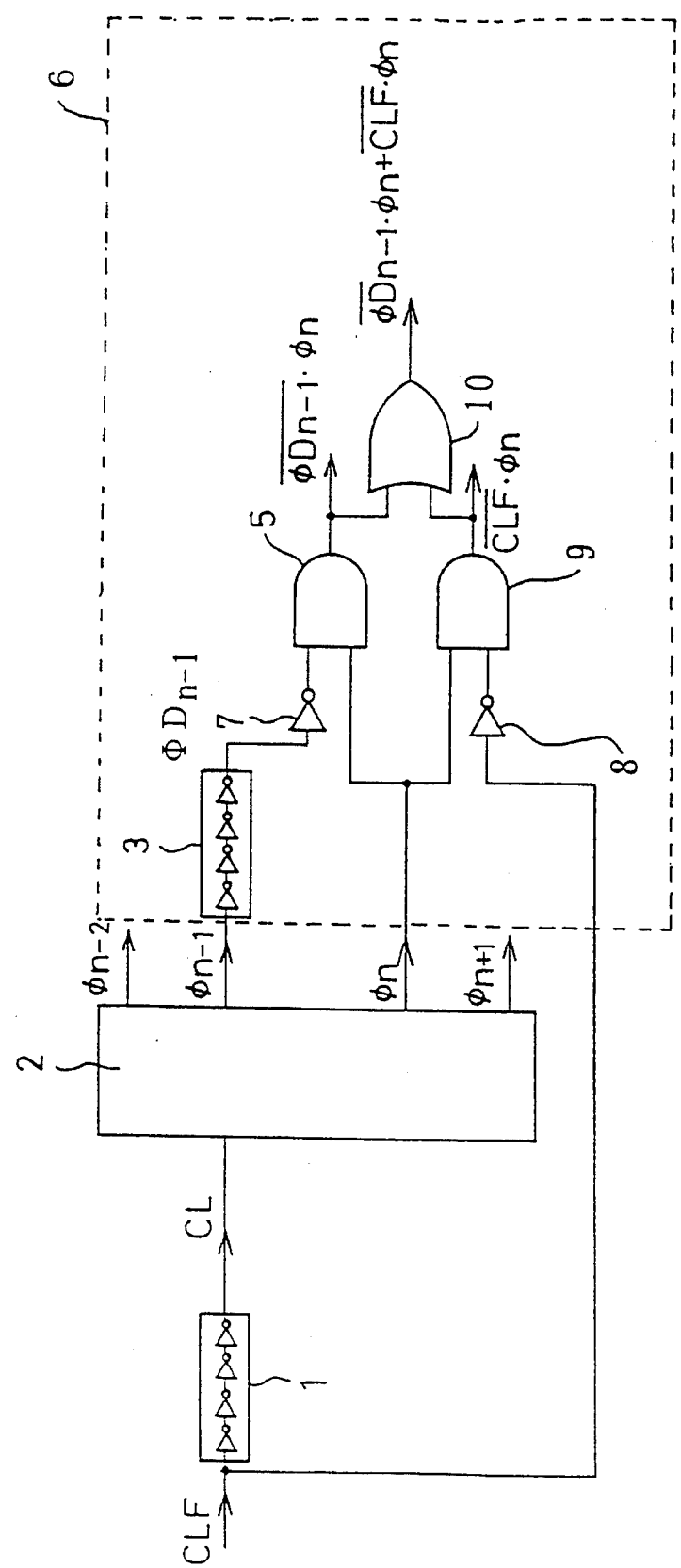
FIG. 3 is a circuit diagram illustrative of a second embodiment of the present invention.

Turning to FIG. 3, a clock generator according to the second embodiment of the present invention includes delay circuits 1 and 3, a divider 2, two inverters 7 and 8, two AND gates 5 and 9, and an OR gate 10, which are connected as shown. The divider 2 is same in operation as the divider 2 shown in FIG. 1.

Figure 7:
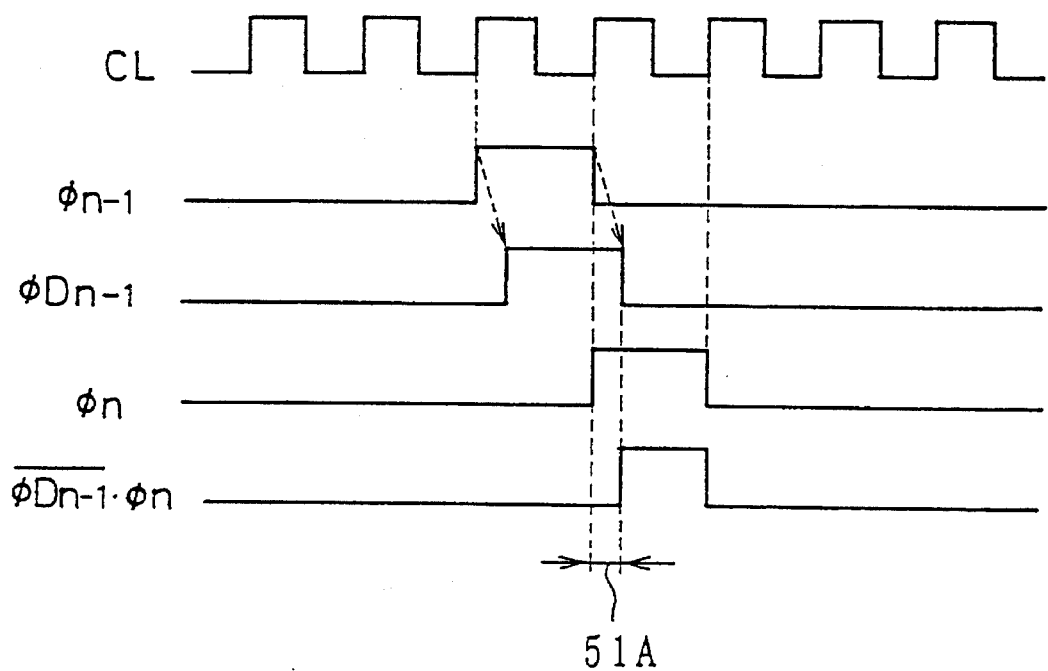
FIG. 7 to FIG. 12 are timing charts indicating operations of the circuit shown in FIG. 3.

In operation, the delay circuit 3 produces a delay clock signal $\Phi D_{n-1}$ which is in turn supplied through the inverter 7 to the NAND gate 5 which also receives the clock signal $\Phi_n$. Accordingly, the AND gate 5 generates a logical product signal of these signals, that is $\overline{\Phi D_{n-1}}\cdot\Phi_n$ as shown in FIG. 7. The phase difference between this signal $\overline{\Phi D_{n-1}}\cdot\Phi_n$ and the clock $\Phi_n$ represents a first clock-to-clock delay 51A.

Figure 8:
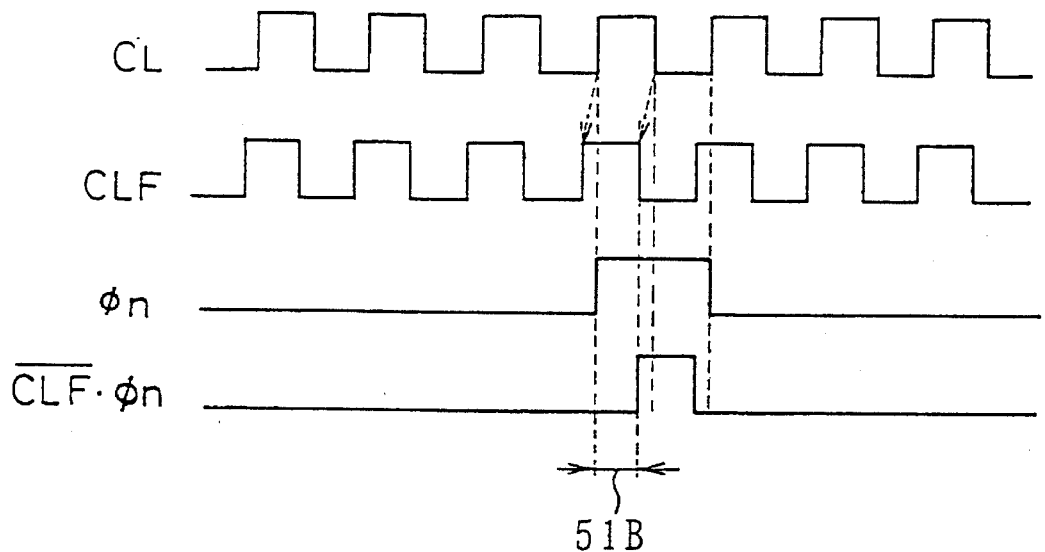

On the other hand, the reference clock CL, is inverted by the inverter 8 to produce a signal $\overline{CLF}$ which is ANDed with the clock $\Phi_n$ to generate a signal ($\overline{CLF}\cdot\Phi_n$) as shown in FIG. 8. The phase difference between the signal ($\overline{CLF}\cdot\Phi_n$) and the clock $\Phi_n$ represents a second clock-to-clock delay 51A.

Figure 9:
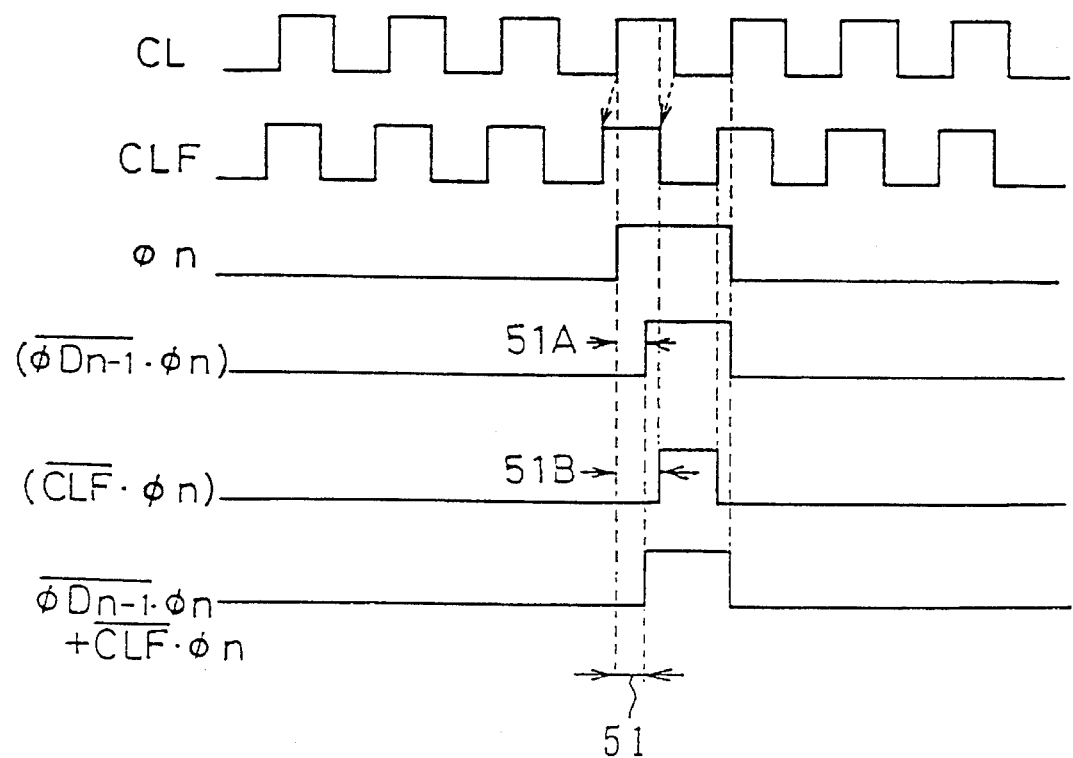

As is seen from FIG. 9, the clock-to-clock delay 51B is given as a differential of one-half the rate of the reference clock CL minus the delay time of the delay circuit 1. Thus the clock-to-clock delay 51B may be set to an optional value by changing the number of inverter stages making up the delay circuit 1 for changing the delay time of the delay circuit 1.

It is noted that producing a logical sum of the signals ($\overline{\Phi D_{n-1}}\cdot\Phi_n$) and ($\overline{CLF}\cdot\Phi_n$) by the two-input OR gate is equivalent to selecting the first clock-to-clock delay 51A or the second clock-to-clock delay 51B, whichever is smaller in the delay magnitude, and employing the selected signal as the clock-to-clock delay 51 between the clock $\Phi_n$ and the signal ($\overline{\Phi D_{n-1}}\cdot\Phi_n + \overline{CLF}\cdot\Phi_n$).

The circuit structure of ANDing the signals ($\overline{\Phi D_{n-1}}\cdot\Phi_n$) and ($\overline{CLF}\cdot\Phi_n$) and selecting the delay generated from these signals $\overline{\Phi D_{n-1}}\cdot\Phi_n$ or ($\overline{CLF}\cdot\Phi_n$), whichever is smaller as the clock-to-clock delay, constitutes one of important features of the present invention.

Figure 10:
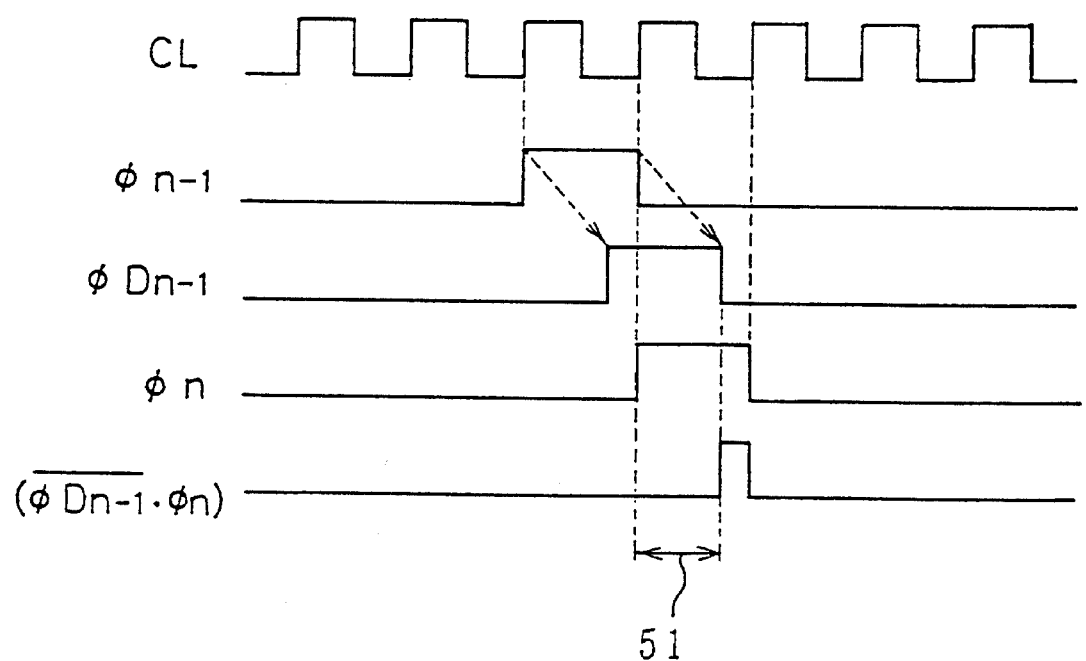
Figure 11:
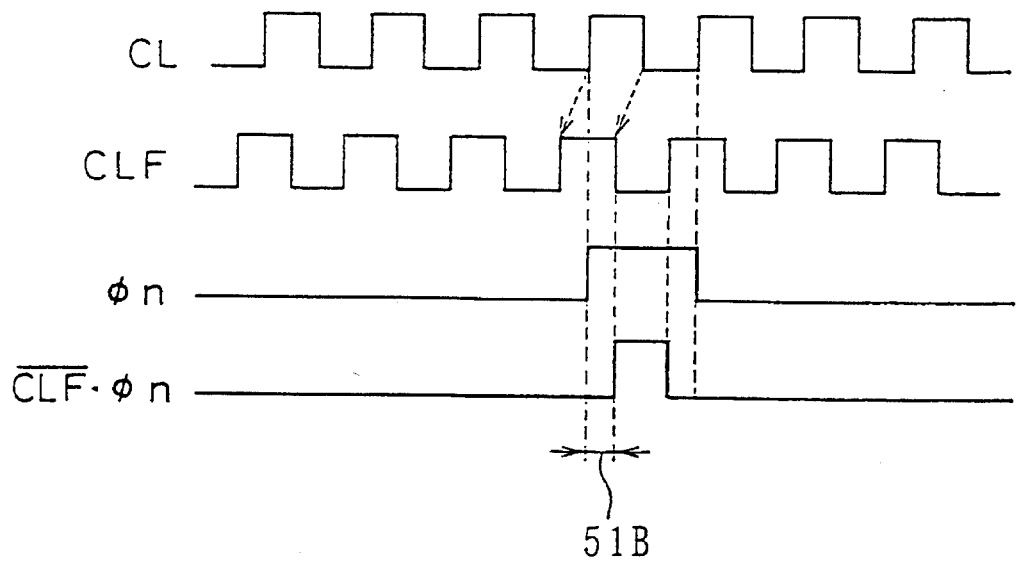

When the power supply voltage is lowered, the delay time of the delayer circuit 3 is prolonged, so that the AND gates 5 and 9 produce the respective outputs as shown in FIGS. 10 and 11. The clock-to-clock delay 51B becomes smaller than the second clock-to-clock delay 51A.

Figure 12:
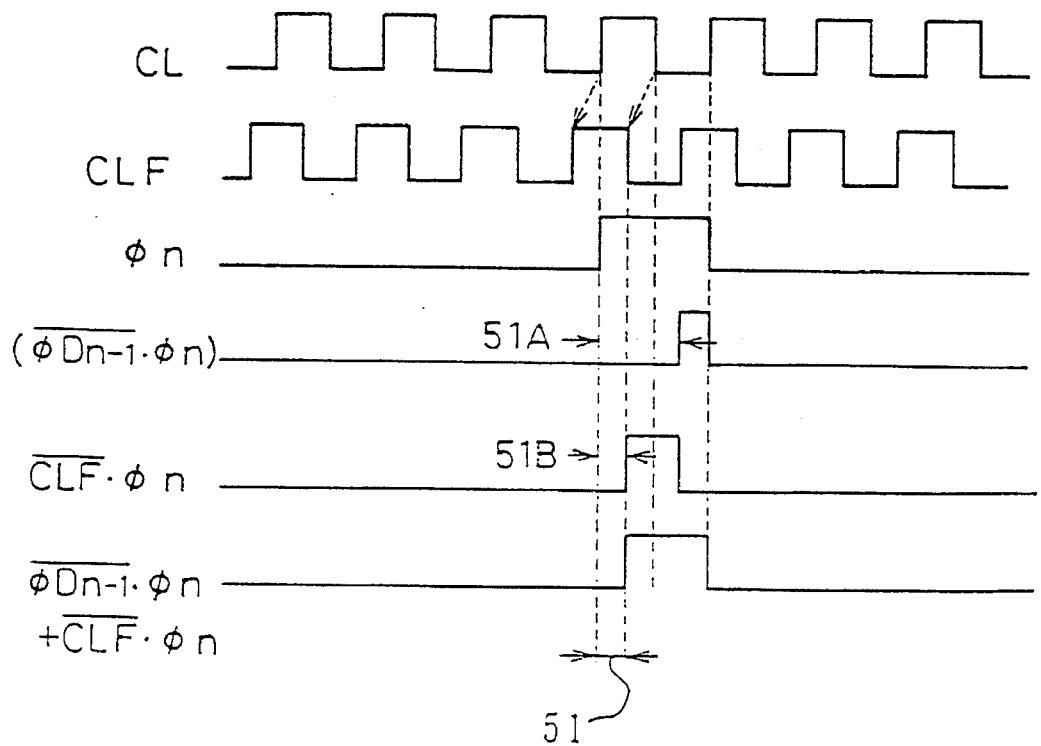

It is therefore seen from FIG. 12 that the finally produced clock-to-clock delay 51 is not larger than the time equal to one-half the rate of the basic clock CL minus the delay time of the delay circuit 1. That is, the clock-to-clock delay 51 has its upper limit set by the delay time equal to one-half the rate of the reference clock CL minus the delay time of the delay circuit 1.

By such structure of the present embodiment, the minimum clock active width (in the present embodiment, the minimum clock active width equal to one-half the rate of the reference clock CL minus the delay time of the delay circuit 1) is guaranteed in the clocks employed as actual time base even if the delay becomes excessively large such as during low-voltage operations.

On the other hand, since the delay time of the delay circuit 1 may be optionally changed simply by changing the number of the inverter stages making up the delay circuit 1, as discussed above, the upper limit of the clock-to-clock delay 51 can be limited to any optional value. The fact that the clock active width can be in the generated clocks and the upper limit of the clock-to-clock delay can be set constitutes one of the main features of the present invention.

Figure 19:
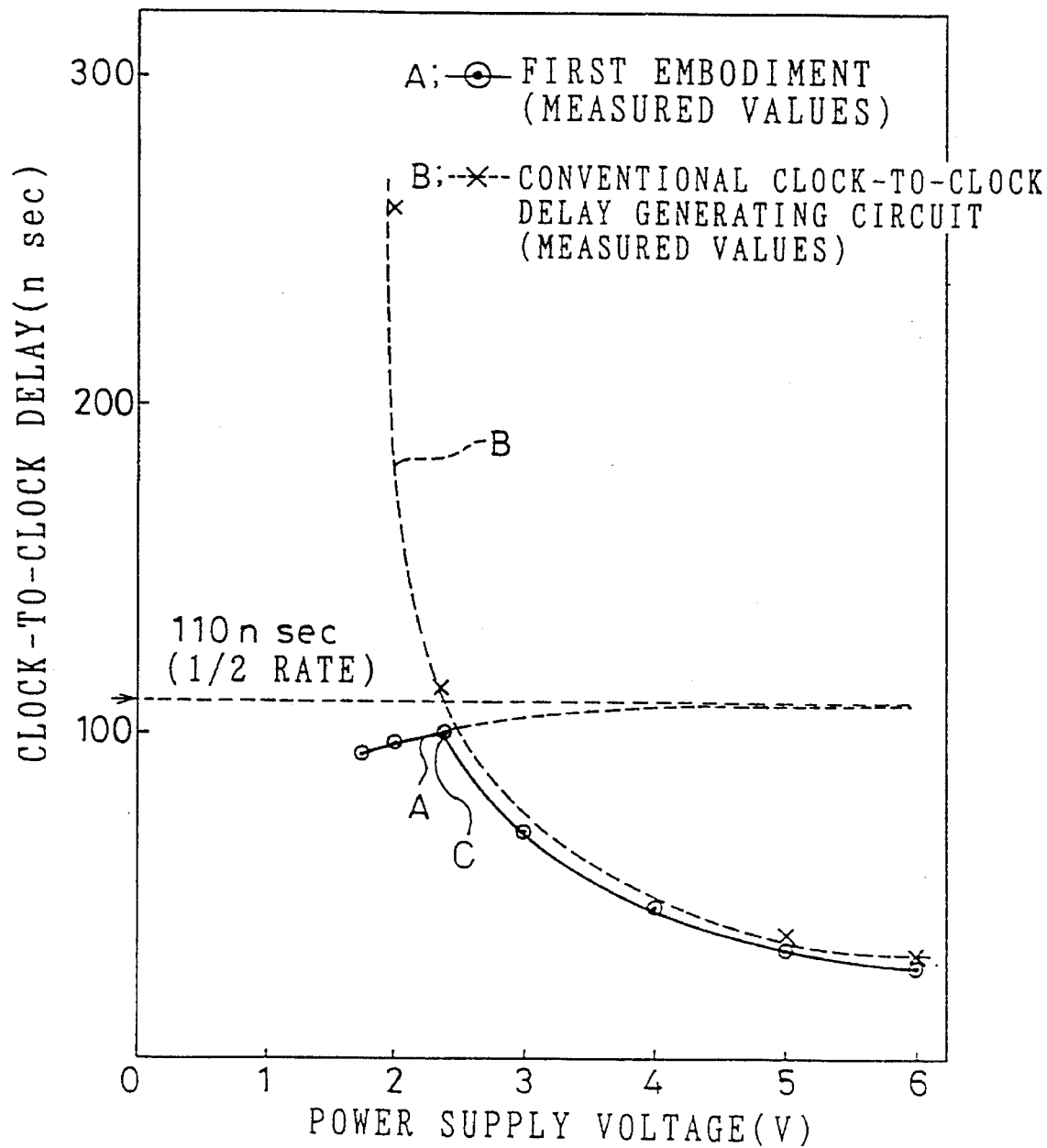
FIG. 19 is a chart showing measured data of delay for comparison of characteristics of a power supply voltage variation of the present invention and the prior art.

FIG. 19 shows the results of evaluation of the above-described clock-to-clock delay generating circuit of the present embodiment, as measured on an actual circuit (actual device). In FIG. 19, a curve B (broken line) represents measured data of the clock-to-clock delays in case of employing the conventional clock-to-clock generating circuit, shown in FIG. 11, while a curve A (solid line) represents measured data in case of employing the clock-to-clock generating circuit according to the present embodiment. The clock rate of the reference clock CL is set to 220 nsec.

With the curve B for the conventional example, the clock-to-clock delay is increased with the lowering of the power supply voltage, as shown in FIG. 19. With the curve A for the present embodiment, the clock-to-clock delay, which tends to be increased at the outset with the lowering of the power supply voltage, as in the case of the conventional example, ceases to be increased at a point C (the power supply voltage is about 2.4 V) in FIG. 19 as a boundary point. As from this boundary point, the clock-to-clock delay is decreased with the lowering of the power supply voltage.

It is also seen from FIG. 19 that, when the power supply voltage becomes smaller than approximately 2 V, the clock-to-clock delay reaches to a large value of approximately 260 ns with the conventional delay generating circuit, whereas the clock-to-clock delay with the present embodiment is limited to approximately 95 nsec, which is equal to one-half of the clock rate of the reference clock CL or 110 ns, minus the delay of the delay circuit 1, which in the actual device is approximately 15 nsec, without being increased beyond such limit value.

In FIG. 19, the curve A for the present embodiment is associated with the fact that the delay time equal to one-half the clock rate of the reference clocks CL, or 110 nsec, minus the delay time of the delay circuit 1 (this delay time corresponds to the portion of the curve A on the left-hand side of a point C and a dotted-line curve asymptotically approaching the line of 110 ns as the power supply voltage is increased) or the delay of the output $\overline{\Phi D_{n-1}}\cdot\Phi_n$ of the delay generating circuit 71 of the conventional example (the delay is increased with the decrease in the power supply voltage), whichever is smaller, is used as the clock-to-clock delay in the present embodiment.

Figure 4:
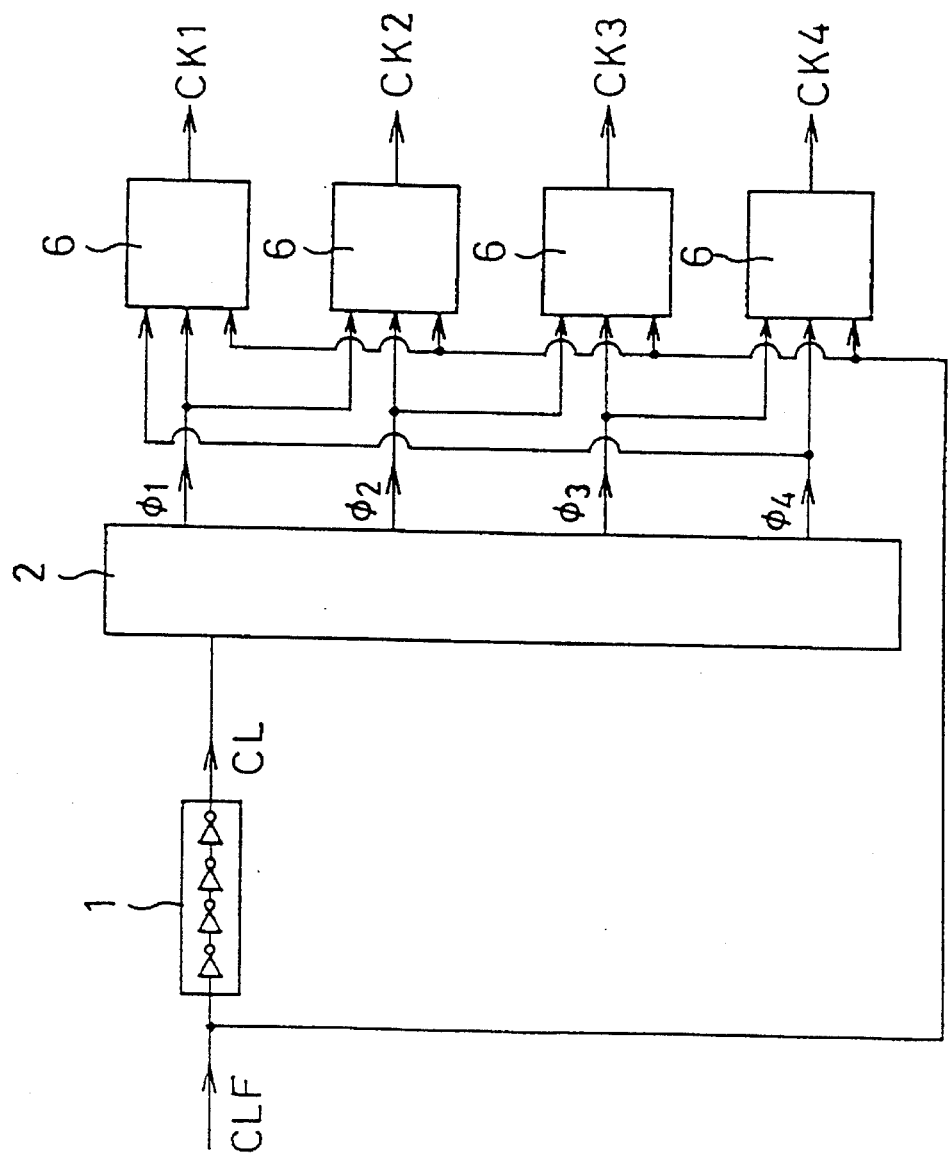
FIG. 4 is a block diagram showing an arrangement of a clock generator employing a circuit portion 6 shown in FIG. 1 or FIG. 3.
Figure 13:
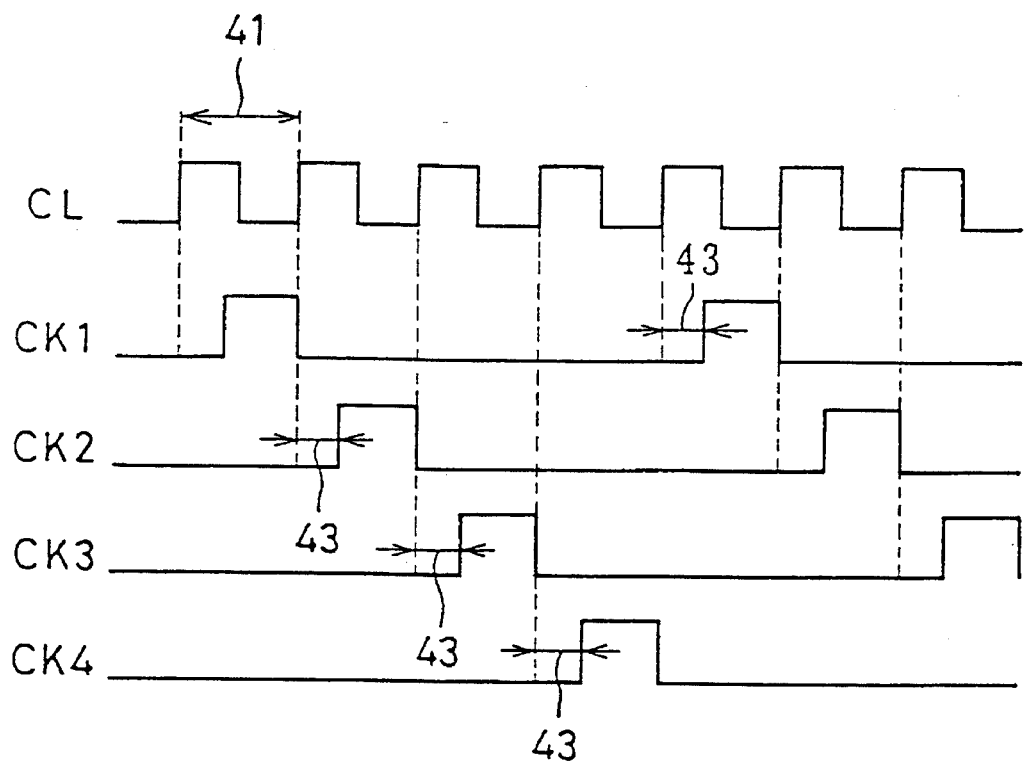
FIG. 13 is a timing chart illustrative of output clock generated by the clock generator shown in FIG. 4.

In the case where four-phase non-overlapping clocks $\Phi_1$, $\Phi_2$, $\Phi_3$ and $\Phi_4$ as shown in FIG. 13 are required, four circuit blocks 6 are employed and coupled to the divider 2, as shown in FIG. 4. Each of the blocks 6 has the circuit construction as shown in FIG. 1 or FIG. 3.

Figure 5:
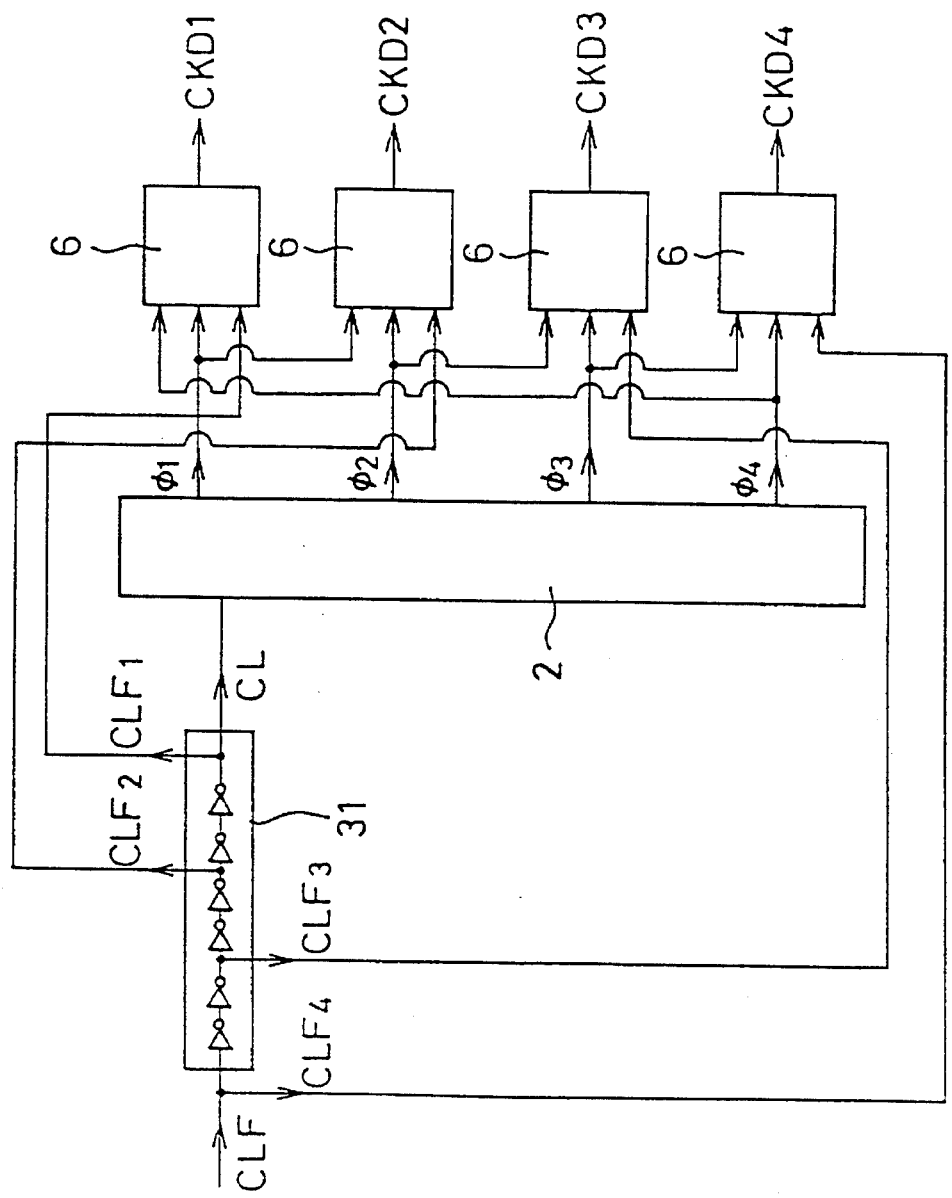
FIG. 5 is a block diagram showing an arrangement of a clock generator according to a third embodiment of the present invention.
Figure 14:
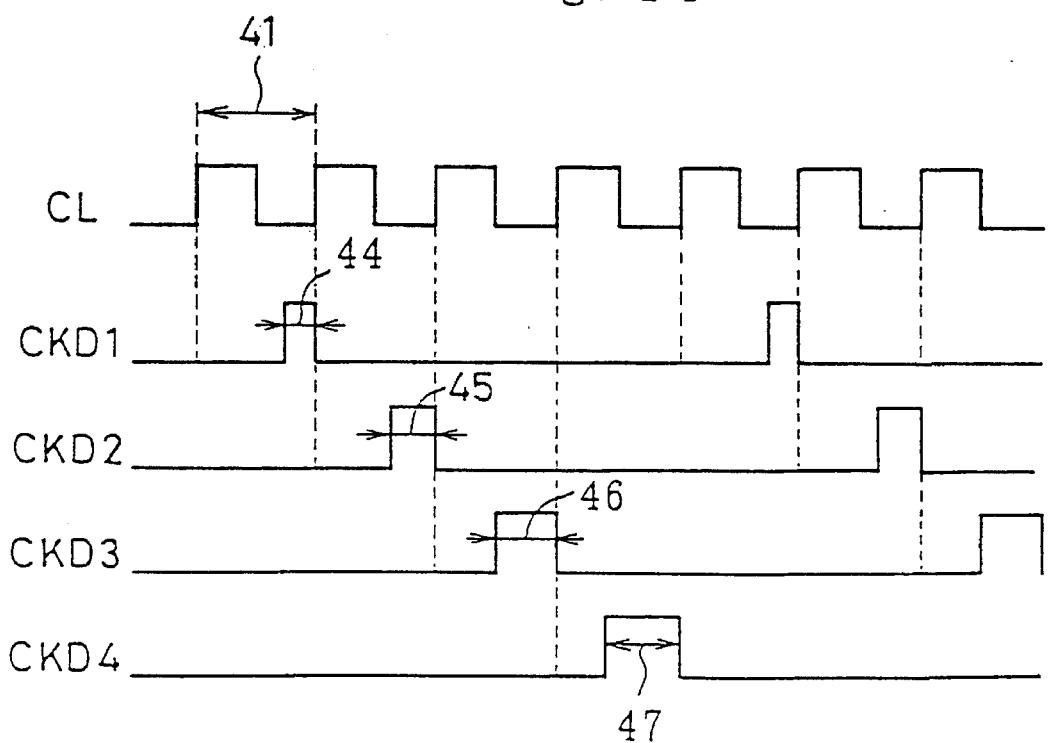
FIG. 14 is a timing chart illustrative of output clocks generated by the clock generator shown in FIG. 5.
Figure 15:
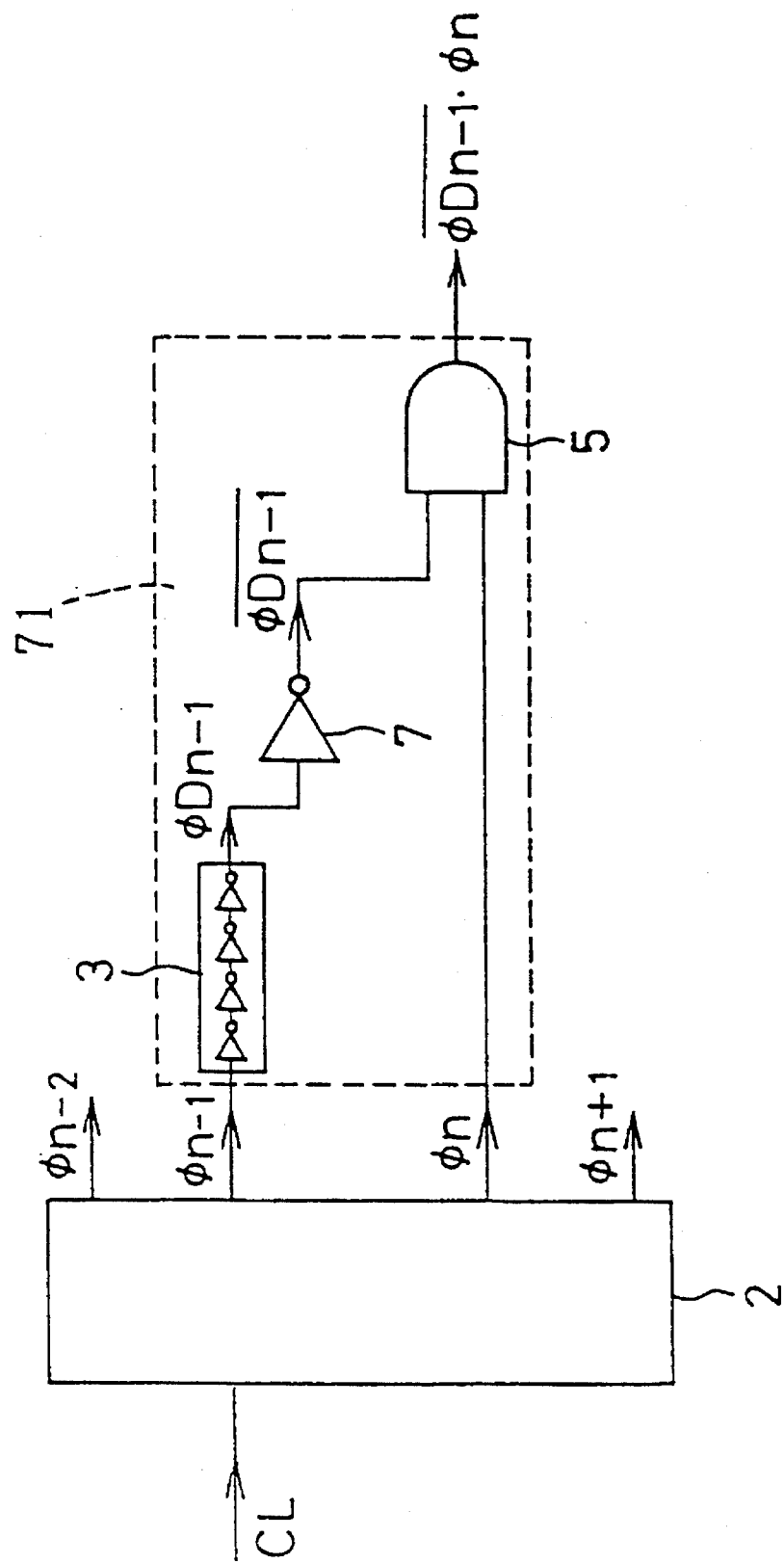
FIG. 15 is a circuit diagram showing an arrangement of a prior art circuit.
Figure 16:
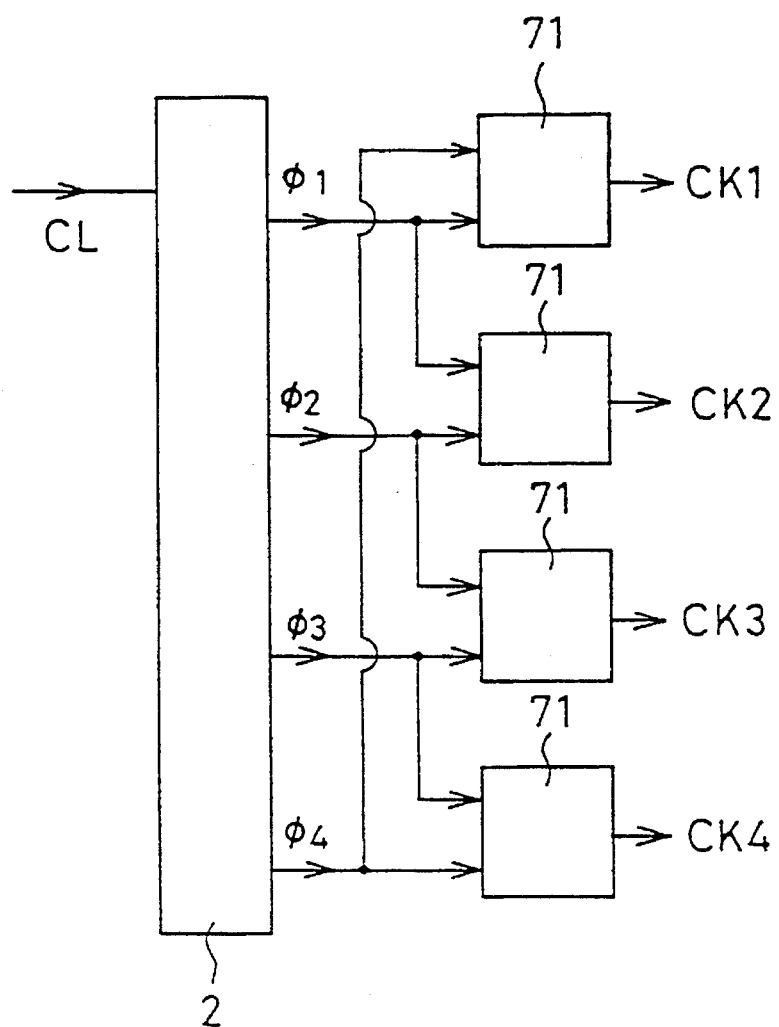
FIG. 16 is a circuit diagram showing an arrangement of a prior art clock generator employing the circuit shown in FIG. 15.
Figure 17:
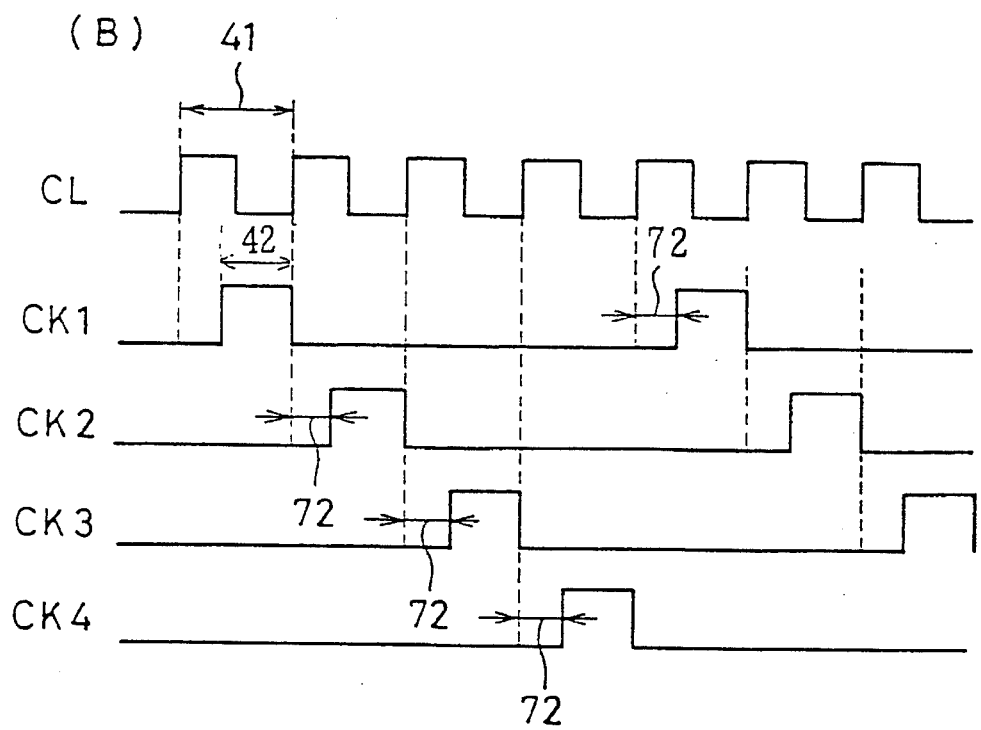
FIGS. 17 and 18 are timing charts for illustrating the operation of the prior art circuit.
Figure 18:
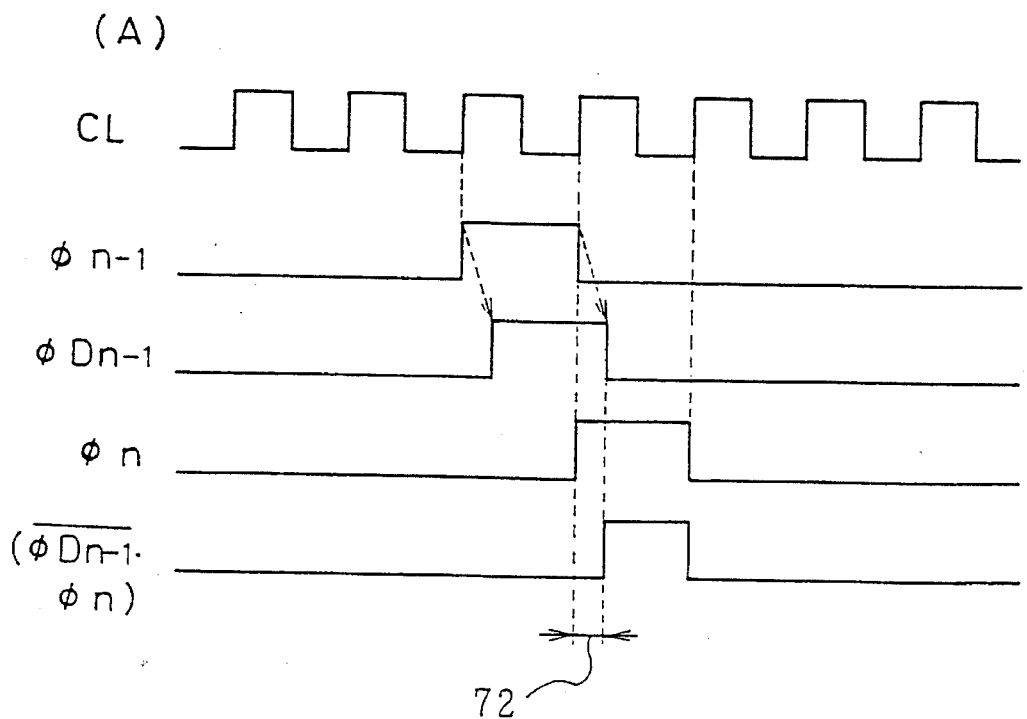

Referring now to FIG. 5, the clock generator according to the third embodiment of the invention generates four phase non-overlapping clocks $CKD_1$, $CKD_2$, $CKD_3$ and $CKD_4$ capable of having clock active widths different from one another, as shown in FIG. 14, using four-phase clocks $\Phi_1$, $\Phi_2$, $\Phi_3$ and $\Phi_4$, each of which is generated by frequency-dividing the delayed clocks CL. In this clock generator, a delay circuit 31 is employed in place of the delay circuit 1 shown in FIGS. 1, 3 and 4. In addition, as the input signals fed to the circuit portions 6 respectively generating the clocks $CKD_1$, $CKD_2$, $CKD_3$ and $CKD_4$, four reference clock signals $CLF_1$, $CLF_2$, $CLF_3$ and $CLF_4$ different from one another, are employed.

With such a construction as described above, this clock generator generating the clocks $CKD_1$, $CKD_2$, $CKD_3$ and $CKD_4$ of FIG. 14 have upper limits of the delay from the delay circuit 31 different from one another, so that, even if the delay is increased in magnitude, such as during low-voltage operations, it becomes possible for the clocks $CKD_1$, $CKD_2$, $CKD_3$ and $CKD_4$ to have clock active widths different from one another.

It is apparent that the above described preferred embodiments are illustrative and not restrictive, and the scope of the invention being indicated by the appended claims and all variations which come within the meaning of the claims are intended to be embraced therein.

What is claimed is:

1. A clock generating circuit comprising:

a first delay circuit for receiving a reference clock signal and for producing a delayed reference clock signal;

first circuit means responsive to said delayed reference clock signal for generating a set of intermediate clock signals, each of said intermediate clock signals having a clock active width corresponding to an integer number multiple of one cycle period of said delayed reference clock signal, and said intermediate clock signals having respective clock active widths which are delayed in sequence by a value corresponding to said integer number multiple of the clock width of said delayed reference clock signal; and at least one delay generating circuit for receiving an (n−1)th intermediate clock signal, where n is an integer greater than zero, and an n-th intermediate clock signal of said intermediate clock signals adjacent each other in a phase sequence and said reference clock signal, said at least one delay generating circuit including a second delay circuit for receiving said (n−1)th intermediate clock signal and for producing a delayed intermediate clock signal and a circuit arrangement responding to said delayed intermediate clock signal, said n-th intermediate clock signal and said reference clock signal and for generating an output clock signal having a delay time relative to said n-th intermediate clock signal, said delay time being defined by a delay time having a smaller value between a clock active width of the reference clock signal minus a delay time of the first delay circuit and a delay time of said second delay circuit.

2. The clock delay generating circuit as defined in claim 1 wherein the clock active width of each of the intermediate clock signals is set to a half of the one cycle period of the reference clock signal.

3. A clock-to-clock delay generating circuit, comprising:

a first delay circuit for delaying a first reference clock supplied thereto as an input, said first reference clock having an optional clock rate, a frequency divider for receiving an output of said first delay circuit as a second reference clock and for generating a group of multi-phase clocks, each of said multi-phase clocks having a clock active width corresponding to an integer number multiple of the clock rate of said second reference clock and each having a sequential phase delay having a value corresponding to an integer number multiple of the clock rate of said second reference clock, and a delay generating circuit having as inputs a (n−1)th clock, where n is an integer greater than zero, and a n-th clock in said group of the multi-phase clocks adjacent each other in the phase sequence and said first reference clock, said delay generating circuit comprising a second delay circuit for delaying the (n−1)th clock in the phase sequence, a NAND gate having an output of the second delay circuit as a first input and said first reference clock as a second input, and an AND gate having an output of said NAND gate as a first input and the n-th clock in the phase sequence of the group of the multi-phase clocks as a second input, an output of said AND gate being an output signal of the delay generating circuit.

4. A clock-to-clock delay generating circuit, comprising:

a first delay circuit for delaying a first reference clock supplied thereto as an input, said first reference clock having an optional clock rate, a frequency divider for receiving an output of said first delay circuit as a second reference clock and for generating a group of multi-phase clocks each having a clock active width corresponding to an integer number multiple of the clock rate of said second reference clock and each of said multi-phase clocks having a sequential phase delay having a value corresponding to an integer number multiple of the clock rate of said second reference clock, and a delay generating circuit having as inputs a (n−1)th clock and a n-th clock, where n is an integer greater than zero, in said group of the multi-phase clocks adjacent each other in the phase sequence and said first reference clock, said delay generating circuit comprising a second delay circuit for delaying the (n−1)th clock in the phase sequence, a first AND gate having an output of the second delay circuit via a first inverter as a first input and a n-th clock of the group of the multi-phase clocks in phase sequence as a second input, a second AND gate having said first reference clock via a second inverter as a first input and the n-th clock of the group of the multi-phase clocks in phase sequence as a second input, and an OR gate having outputs of said first and second AND gates as inputs, an output of said OR gate being an output signal of the delay generating circuit.

5. A clock generating circuit, comprising:

a first delay circuit for delaying a first reference clock supplied thereto as an input, said first reference clock having an optional clock rate, a frequency divider for receiving an output of said first delay circuit as a second reference clock and for generating a group of multi-phase clocks each having a clock active width corresponding to an integer number multiple of the clock rate of said second reference clock and each having a sequential phase delay having a value corresponding to an integer number multiple of the clock rate of said second reference clock, and a plurality of delay generating circuits, each of said delay generating circuit having as inputs a (n−1)th clock and a n-th clock, where n is an integer greater than zero, in said group of the multi-phase clocks neighboring to each other in the phase sequence, and said first reference clock, and comprising a second delay circuit for delaying the (n−1)th clock in the phase sequence, and a circuit arrangement generating an output clock signal having a delay time relative to said n-th clock, said delay time being a smaller value between a clock active width of the first reference clock minus a delay time of the first delay circuit and a delay time of said second delay circuit, said delay generating circuits outputting a group of multi-phase clocks, said multi-phase clocks having no overlap with one another.

6. The clock generating circuit as defined in claim 5 wherein the clock active width of the first reference clock is set to one half of the clock width.

7. A clock generating circuit comprising:

a first delay circuit for delaying a first reference clock supplied thereto, and outputting a plurality of delayed reference clocks being different in delay time from each other, said plurality of delayed reference clocks including a second reference clock, a frequency divider for receiving said second reference clock and for generating a group of multi-phase clocks each having a clock active width corresponding to an integer number multiple of the clock rate of said second reference clock and each having a sequential phase delay having a value corresponding to an integer number multiple of the clock rate of said second reference clock, and a plurality of delay generating circuits, each of said delay generating circuits having as inputs a (n−1)th clock and a n-th clock, where n is an integer greater than zero, in said group of the multi-phase clocks adjacent each other in the phase sequence, and an associated one of said delayed reference clocks and comprising a second delay circuit for delaying the (n−1)th clock in the phase sequence, and a circuit arrangement for generating an output clock signal having a delay time relative to said n-th clock, having a smaller value between a clock active width of the first reference clock minus a delay time of an associated one of said delayed reference clocks and a delay time of said second delay circuit, said delay generating circuits outputting respective clock signals that have no overlap with one another.

* * * * *